US008145443B2

(12) United States Patent
Kang et al.

(10) Patent No.: US 8,145,443 B2
(45) Date of Patent: Mar. 27, 2012

(54) FOURIER TRANSFORM-BASED PHASOR ESTIMATION METHOD AND APPARATUS CAPABLE OF ELIMINATING INFLUENCE OF EXPONENTIALLY DECAYING DC OFFSETS

(75) Inventors: Sang Hee Kang, Seoul (KR); Dong Gyu Lee, Yongin-si (KR)

(73) Assignee: Myongji University Industry and Academia Cooperation Foundation, Gyeonggi-do (KR)

( * ) Notice: Subject to any disclaimer, the term of this patent is extended or adjusted under 35 U.S.C. 154(b) by 401 days.

(21) Appl. No.: 12/423,223

(22) Filed: Apr. 14, 2009

(65) Prior Publication Data

US 2009/0299666 A1    Dec. 3, 2009

(30) Foreign Application Priority Data

May 29, 2008 (KR) .......................... 10-2008-0050328

(51) Int. Cl.
*G01R 23/16* (2006.01)
(52) U.S. Cl. ............ 702/77; 702/58; 702/191; 702/197; 361/93.2; 361/80; 361/65; 361/59; 361/93.4; 361/90; 361/92; 361/61; 361/71; 361/75; 324/115; 324/539; 324/547
(58) Field of Classification Search .................... 702/58, 702/77, 191, 197; 361/93.2, 80, 65, 59, 61, 361/71, 75, 93.4, 90, 92; 324/539, 115, 522, 324/536, 547
See application file for complete search history.

(56) References Cited

U.S. PATENT DOCUMENTS

| 5,224,011 A * | 6/1993 | Yalla et al. .................... 361/93.2 |
| 5,701,080 A * | 12/1997 | Schumacher et al. ........ 324/539 |
| 6,075,368 A * | 6/2000 | Schumacher et al. ........ 324/539 |
| 7,948,420 B1 * | 5/2011 | Brahma et al. ................ 341/155 |

* cited by examiner

*Primary Examiner* — Carol Tsai
(74) *Attorney, Agent, or Firm* — The Webb Law Firm

(57) ABSTRACT

Disclosed herein is a Fourier transform-based phasor estimation method and apparatus capable of eliminating the influence of exponentially decaying DC offsets. According to a Fourier transform-based phasor estimation method according to an embodiment of the present invention, an input signal is sampled, and samples of one-cycle data of the input signal are separated into at least two sample groups. A Discrete Fourier Transform (DFT) is performed on each of the sample groups. A DC offset included in the input signal is calculated on a basis of results of the DFT on each of the sample groups, and an error caused by the DC offset is calculated using the calculated DC offset. A phasor of a fundamental frequency component included in the input signal is estimated by eliminating the calculated error, caused by the DC offset, from the results of the DFT on the input signal.

7 Claims, 10 Drawing Sheets

(a) $\tau_1$ = 0.5 Cycle

FOURIER TRANSFORM-BASED PHASOR ESTIMATION METHOD AND APPARATUS CAPABLE OF ELIMINATING INFLUENCE OF EXPONENTIALLY DECAYING DC OFFSETS

BACKGROUND OF THE INVENTION

1. Field of the Invention

The present invention relates to Fourier transform-based phasor estimation, and, more particularly, to a Fourier transform-based phasor estimation method and apparatus capable of eliminating the influence of exponentially decaying DC offsets, which can accurately estimate the phasor of an input signal, including one or more DC offsets, by eliminating the influence of the DC offsets from the input signal.

2. Description of the Related Art

A Discrete Fourier Transform (DFT) is a method generally used to estimate the phasor of an fundamental frequency component in various types of protection and control devices, and enables a phasor to be accurately estimated when conditions, such as i) a condition in which the frequency of a highest-order harmonic, included in an input signal, is lower than ½ of a sampling frequency, and ii) a condition in which a non-periodic signal, for example, an exponentially decaying DC offset component, is not included in the input signal, are satisfied.

In practice, the condition i) can be satisfied by filtering an input signal using a low-pass or band-pass filter, but the condition ii) is not satisfied in the case of fault current including an exponentially decaying DC offset component, other than a sinusoidal component.

Fault current, flowing through a power system when a fault occurs, can be represented by a combination of sinusoidal components and an exponentially decaying DC offset component. When a fault resistor exists, fault current includes two or more DC offset components.

Further, current flowing through a power system is measured by a Current Transformer (CT), and the secondary current of the CT, used as the input of a protection relay, includes another DC offset component due to the influence of the CT circuit.

An exponentially decaying DC offset component is a non-periodic signal, and exhibits characteristics of having arbitrary values in all frequency bands. Accordingly, when a phasor is calculated using a DFT, the DC offset component greatly influences accuracy, which results in the mal-operation/dead operation of a protection relay and the decrease in the accuracy of a measuring device. Therefore, in order to implement a high-performance protection and control device, the DC offset component should be taken in to consideration in calculating the phasor of the fundamental frequency component of a relaying signal.

For reducing or eliminating the influence of a DC offset, a method using a digital mimic filter has been proposed, and this method is configured such that the time constant of a DC offset is assumed to be a specific value at the time of designing a mimic filter.

However, since the time constant of a DC offset component varies depending on the system configuration and fault conditions such as a fault location, a fault resistance, etc., an error occurs when the time constant of a DC offset, included in fault current, differs from the time constant assumed when the filter is designed.

In order to remove the error caused by the difference between the actual and presumed time constants of the DC offset, methods (modified DFT methods) of calculating a DC offset component using the results of a Fourier transform and compensating for the output of a Fourier filter using the calculated DC offset component have been proposed.

These methods are advantageous in that the phasor of a fundamental frequency component can be accurately calculated, regardless of the time constant of a DC offset, but are disadvantageous in that the methods additionally require two samples to calculate a DC offset component in addition to one-cycle data required for a Fourier transform, and are vulnerable to high-frequency noise.

In order to prevent additional samples from being used in addition to one-cycle data required for a Fourier transform, a method of estimating a DC offset component using the results of a DFT of a harmonic component higher than the cutoff frequency of a low pass filter, and a method of introducing the concept of an instantaneous phasor to improve the conversion speed of a Fourier transform and eliminating the influence of a DC offset using a notch filter have been proposed. These methods can accurately eliminate the influence of a DC offset, but are greatly influenced by random noise or harmonics.

Meanwhile, a Partial Sum (PS) method of dividing one-cycle data into odd-numbered samples and even-numbered samples, performing two integral operations on the samples, and estimating a DC component using the results of the integral operations has been proposed. This method not only uses one-cycle data, but also is robust to noise. However, this method is disadvantageous in that an error is caused when the input signal contains two or more decaying DC offset components with different time constants.

SUMMARY OF THE INVENTION

Accordingly, the present invention has been made keeping in mind the above problems occurring in the prior art, and an object of the present invention is to provide a Fourier transform-based phasor estimation method and apparatus capable of eliminating the influence of exponentially decaying DC offsets, which can accurately estimate the phasor of a fundamental frequency component by eliminating the influence of one or more DC offset components included in an input signal.

Another object of the present invention is to provide a Fourier transform-based phasor estimation method and apparatus capable of eliminating the influence of exponentially decaying DC offsets, which can stably estimate the phasor of a fundamental frequency component using only one-cycle data of an input signal.

In accordance with an aspect of the present invention to accomplish the above objects, there is provided a Fourier transform-based phasor estimation method, comprising sampling an input signal and separating samples of one-cycle data of the input signal into at least two groups of samples; executing a Discrete Fourier Transform (DFT) with each of the sample groups; calculating a DC offset component included in the input signal on a basis of results of the DFT executed with each of the sample groups, and calculating an error caused by the DC offset on the DFT using the calculated DC offset component, and estimating a phasor of a fundamental frequency component included in the input signal by eliminating the calculated error, caused by the DC offset, from the results of the DFT.

Preferably, the Fourier transform-based phasor estimation method may further comprise calculating a difference between results of DFTs executed with the two groups of samples, and filtering the calculated difference with a low-pass filter having a cutoff frequency preset so as to eliminate noise amplified by the difference.

In accordance with another aspect of the present invention to accomplish the above objects, there is provided a Fourier transform-based phasor estimation apparatus, comprising a separation unit for separating samples of one-cycle input data into at least two sample groups; a Discrete Fourier Transform (DFT) unit for executing a DFT with each of the sample groups, obtained from the separation unit; a DC offset calculation unit for calculating a DC offset, included in the input signal, on a basis of results of the DFT executed with each of the sample groups performed by the DFT unit, and calculating an error caused by the DC offset using the calculated DC offset; and a phasor estimation unit for estimating a phasor of a fundamental frequency component included in the input signal by eliminating the error caused by the DC offset, calculated by the DC offset calculation unit, from the results of the DFT executed with the input signal.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, embodiments of a Fourier transform-based phasor estimation method and apparatus capable of eliminating the influence of exponentially decaying DC offsets according to the present invention will be described in detail with reference to the attached drawings. Further, detailed descriptions may be omitted if it is determined that the detailed descriptions of related well-known functions and constructions may make the gist of the present invention unclear.

Figure 1:
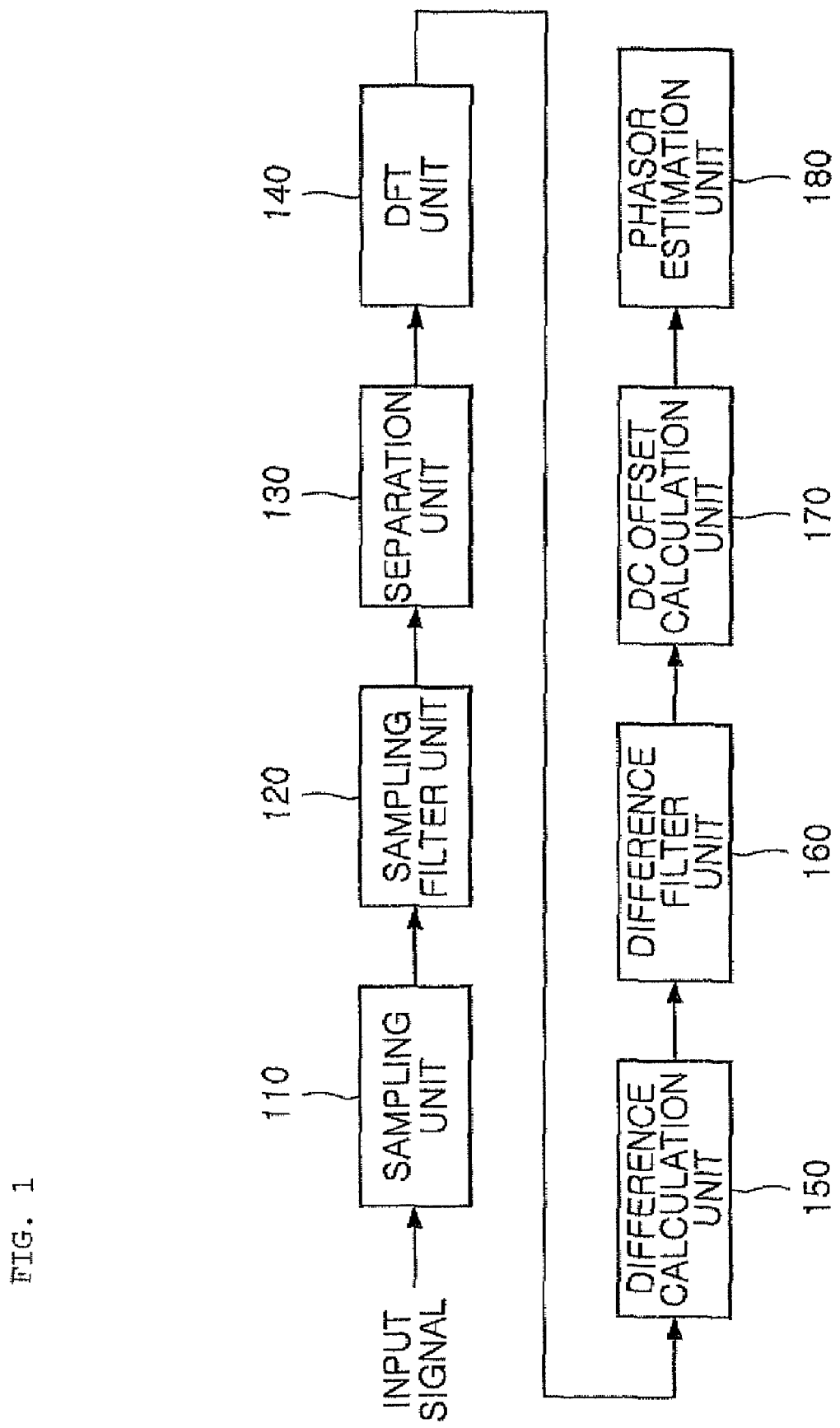
FIG. 1 is a diagram showing the construction of a Fourier transform-based phasor estimation apparatus according to an embodiment of the present invention.

FIG. 1 is a diagram showing the construction of a Fourier transform-based phasor estimation apparatus according to an embodiment of the present invention.

Referring to FIG. 1, the Fourier transform-based phasor estimation apparatus includes a sampling unit 110, a sampling filter unit 120, a separation unit 130, a Discrete Fourier Transform (DFT) unit 140, a difference calculation unit 150, a difference filter unit 160, a DC offset calculation unit 170, and a phasor estimation unit 180.

The sampling unit 110 samples an input signal applied to the apparatus, for example, a current signal, a voltage signal, etc., at a sampling frequency, and outputs samples obtained through the sampling.

In this case, the sampling unit 110 preferably includes an Analog Digital Converter (ADC), and the performance of the ADC may vary depending on the sampling frequency. In order to minimize measurement noise, the sampling unit 110 may sample the input signal using two ADCs with opposite signs.

Here, the input signal, applied to the sampling unit 110, may be a signal directly inputted to the apparatus, but may also be a signal filtered by an analog filter. For example, after the input signal applied to the apparatus is low-pass or band-pass filtered by an analog filter, the filtered signal may be applied to the sampling unit 110.

The sampling filter unit 120 low-pass or band-pass filters the samples, obtained from the sampling unit 110, using filter with a predetermined filtering frequency.

In this case, the sampling filter unit 120 may be a low-pass or band-pass filter for eliminating high-frequency components that their frequency is equal to or greater than the frequency of an N/4-1th harmonic (N is the number of samples per cycle).

The separation unit 130 separates samples of one-cycle data, which has been filtered by the sampling filter unit 120, into at least two sample groups.

In this case, the separation unit can separate the samples of one-cycle data into sample groups with regular sequential intervals. For example, the separation unit may separate samples of one-cycle data into two sample groups, that is, a group of odd-numbered samples and a group of even-numbered samples, or may separate the samples into three or more groups, the samples of each of which have regular sequential intervals. When the number of samples is N, and the samples are separated into three groups, a first group may include samples of 1, 4, 7, ..., N−2, a second group may include samples of 2, 5, 8, ..., N−1, and a third group may include samples corresponding to 3, 6, 9, ..., N.

Hereinafter, the present invention will be described on the assumption that samples of one-cycle data are separated into a group of odd-numbered samples (hereinafter referred to as "odd-numbered samples") and a group of even-numbered samples (hereinafter referred to as "even-numbered samples").

The DFT unit 140 performs a DFT on the odd-numbered samples and a DFT on the even-numbered samples separated by the separation unit 130.

Here, a procedure for calculating a DFT on the odd-numbered samples and a DFT on the even-numbered samples describes follow using a protection relay as an example.

First, a current signal measured by the protection relay can be represented using the following Equation [1], $$i[n] = A_0 e^{-n\Delta t/\tau} + \sum_{k=1}^{N/2-1} A_k \cos\left(\frac{2\pi k}{N}n + \phi_k\right) \quad [1]$$

where i[n] is a current signal, $A_0$ and $\tau$ are the magnitude and time constant of a DC offset component, $A_k$ and $\phi_k$ are the magnitude and phase angle of the sinusoidal component of a k-th harmonic, $\Delta t$ is a sampling interval, and N is the number of sampling times per cycle.

The phasor of a power frequency component, obtained by the DFT of the current signal of Equation [1], is calculated as the following Equation [2], $$I_{DFT} = \frac{2}{N} \cdot \sum_{n=0}^{N-1} \left\{ i(n) \cdot e^{-j\frac{2\pi}{N}n} \right\} \quad [2]$$
$$= I_{DFT}^{1th} + I_{DFT}^{dc}$$
$$I_{DFT}^{1th} = A_1 \cdot e^{j\phi_1}$$
$$I_{DFT}^{dc} = \frac{2}{N} \cdot A_0 \cdot \frac{1-E^N}{1-E \cdot e^{-j\frac{2\pi}{N}}},$$
$$E = e^{-\Delta t/\tau}$$

where $I_{DFT}^{1th}$ is the output of the DFT for the fundamental frequency component of the current signal, $I_{DFT}^{dc}$ is the output of the DFT for the DC offset component of the current signal, and E is the exponential term of the DC offset component.

The following Equation [3] can be obtained by decomposing the DFT for the current signal of Equation [2] into the DFTs for the odd-numbered samples and the even-numbered samples, and the DFT on the even-numbered samples and the DFT on the odd-numbered samples can be respectively rearranged as the following Equations [4] and [5].

$$I_{DFT} = \frac{2}{N} \cdot \sum_{n=0}^{N-1} \left\{ i(n) \cdot e^{-j\frac{2\pi}{N}n} \right\} \quad [3]$$
$$= \frac{2}{N} \cdot \left\{ \sum_{n=0}^{N/2-1} i(2n) \cdot e^{-j\frac{2\pi}{N}2n} \right\} + \frac{2}{N} \cdot \left\{ \sum_{n=0}^{N/2-1} i(2n+1) \cdot e^{-j\frac{2\pi}{N}(2n+1)} \right\}$$
$$= I_{DFT}^{even} + I_{DFT}^{odd}$$

$$I_{DFT}^{even} = \frac{2}{N} \cdot \sum_{n=0}^{N/2-1} i[2n] \cdot e^{-j\frac{2\pi}{N}2n} \quad [4]$$
$$= \frac{2}{N} \cdot \sum_{n=0}^{N/2-1} \left( A_0 E^{2n} + A_1 \cos\left(\frac{2\pi}{N}2n + \phi_1\right) \right) \cdot e^{-j\frac{2\pi}{N}2n}$$
$$= \frac{1}{2} A_1 e^{j\phi_1} + \frac{2}{N} A_0 \sum_{n=0}^{N/2-1} (E^{2n} \cdot e^{-j\frac{2\pi}{N}2n})$$
$$= \frac{1}{2} A_1 e^{j\phi_1} + \frac{2}{N} A_0 \frac{1-E^N}{1-(E \cdot e^{-j\frac{2\pi}{N}})^2}$$

$$I_{DFT}^{odd} = \frac{2}{N} \cdot \sum_{n=0}^{N/2-1} i[2n+1] \cdot e^{-j\frac{2\pi}{N}(2n+1)} \quad [5]$$
$$= \frac{1}{2} A_1 e^{j\phi_1} + \frac{2}{N} E \cdot e^{-j\frac{2\pi}{N}} A_0 \frac{1-E^N}{1-(E \cdot e^{-j\frac{2\pi}{N}})^2}$$

The DFT unit 140 performs a DFT on the even-numbered samples and a DFT on the odd-numbered samples, as indicated in Equations [4] and [5].

The difference calculation unit 150 calculates a difference by subtracting the results of the DFT on the odd-numbered samples, performed by the by the DFT unit 140, from the results of the DFT on the even-numbered samples.

Of course, the difference calculation unit 150 may calculate a difference by subtracting the results of the DFT on the even-numbered samples from the results of the DFT on the odd-numbered samples, and this calculation may be varied according to a process or method in which the apparatus calculates a phasor.

In this case, the difference calculation unit 150 preferably calculates the difference between two groups selected from among three or more sample groups when samples are divided into three or more sample groups.

At this time, the difference calculation unit 150 can calculate the difference between the results of the DFT on the even-numbered samples and the results of the DFT on the odd-numbered samples using the following Equation [6].

$$I_{DFT}^{even} - I_{DFT}^{odd} = \frac{2}{N} A_0 \cdot \frac{1-E^N}{1+E \cdot e^{-j\frac{2\pi}{N}}} \quad [6]$$

The difference filter unit 160 low-pass filters the output of the difference to eliminate high frequency noises, amplified by the subtraction process in the difference calculation unit 150.

That is, although a DFT inherently has very robust characteristics over the high-frequency noises, the subtraction process in the difference calculation unit 150 may cause some errors. It is desirable to use the difference filter unit 160 in order to suppress the errors.

The DC offset calculation unit 170 calculates the magnitude and exponential term of a DC offset, which are DC offset components, using the results of low-pass filtering of the difference between the results of DFTs on the even-numbered samples and the odd-numbered samples, which has been performed by the difference filter unit 160, and calculates an error $I_{DFT}^{dc}$ caused by the DC offset using the calculated exponential term of the DC offset.

Here, a process for calculating the DC offset and the error caused by the DC offset will be described below.

When the difference calculated using Equation [6] is divided into a real part and an imaginary part and is summarized in order to calculate the exponential term of the DC offset, the real part and the imaginary part can be represented by the following Equations [7] and [8].

$$K_{Re} = \text{Re}\{I_{DFT}^{even} - I_{DFT}^{odd}\} \quad [7]$$
$$= \frac{2}{N} A_0 \frac{1-E^N}{1+E^2+2E\cos(2\pi/N)} (1 + E\cos(2\pi/N))$$

$$K_{Im} = \text{Im}\{I_{DFT}^{even} - I_{DFT}^{odd}\} \quad [8]$$
$$= \frac{2}{N} A_0 \frac{1-E^N}{1+E^2+2E\cos(2\pi/N)} E\sin(2\pi/N)$$

The DC offset calculation unit 170 can calculate the exponential term of the DC offset using both the real part and the imaginary part of the difference. Dividing the real part shown in Equation [7] by the imaginary part shown in Equation [8], the exponential term of the DC offset can be obtained, as shown in the following Equation [9].

$$E = \frac{K_{Im}}{K_{Re}\sin(2\pi/N) - K_{Im}\cos(2\pi/N)} \quad [9]$$

That is, the exponential term of the DC offset is calculated using both the difference $I_{DFT}^{even} - I_{DFT}^{odd}$ between the results of the DFT on the even-numbered samples and the results of the DFT on the odd-numbered samples, which is calculated by the difference calculation unit 150, and the number of samples per cycle (N).

The magnitude $A_0$, which is the other component of the DC offset, can be calculated using Equation [6] on the basis of the exponential term of the DC offset calculated using Equation [9].

As described above, the DC offset calculation unit 170 can calculate both the magnitude and the exponential term of the DC offset using Equations [6] to [9].

Further, the DC offset calculation unit 170 can calculate an error due to the DC offset on the DFT, that is, the influence of the DC offset on the DFT, using the calculated exponential term of the DC offset. Such an error due to the DC offset on the DFT an be calculated by the following Equation [10].

$$I_{DFT}^{dc} = (I_{DFT}^{even} - I_{DFT}^{odd}) \cdot \frac{1 + E \cdot e^{-j\frac{2\pi}{N}}}{1 - E \cdot e^{-j\frac{2\pi}{N}}} \quad [10]$$

As shown in Equation [10], the error caused by the DC offset can be calculated using the difference calculated by the difference calculation unit 150, the exponential term of the DC offset calculated using Equation [9], and the number of samples per cycle (N).

The phasor estimation unit 180 estimates the accurate phasor of a fundamental frequency component included in the input signal, using both the error caused by the DC offset, calculated by the DC offset calculation unit 170, and the results of a DFT on the input signal.

That is, the phasor estimation unit 180 can estimate an accurate power frequency component, that is, the phasor of a fundamental frequency component ($I_{DFT}^{1st}$) by eliminating the influence of the DC offset from the results of a DFT ($I_{DFT}$) on the input signal, as shown in the following Equation [11].

$$I_{DFT}^{1th} = I_{DFT} - I_{DFT}^{dc} \quad [11]$$

Figure 2:
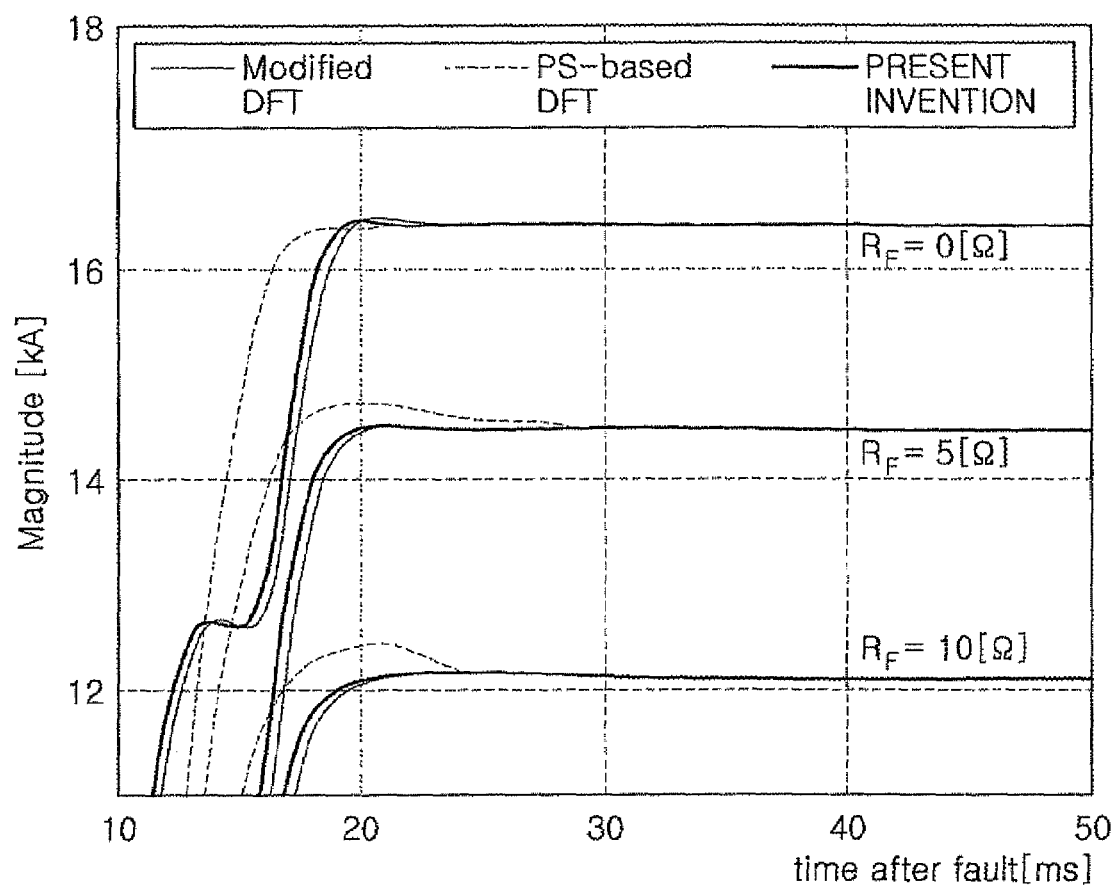
FIG. 2 is a diagram showing an example of the results of a test conduced by the Fourier transform-based phasor estimation apparatus according to the present invention.
Figure 3:
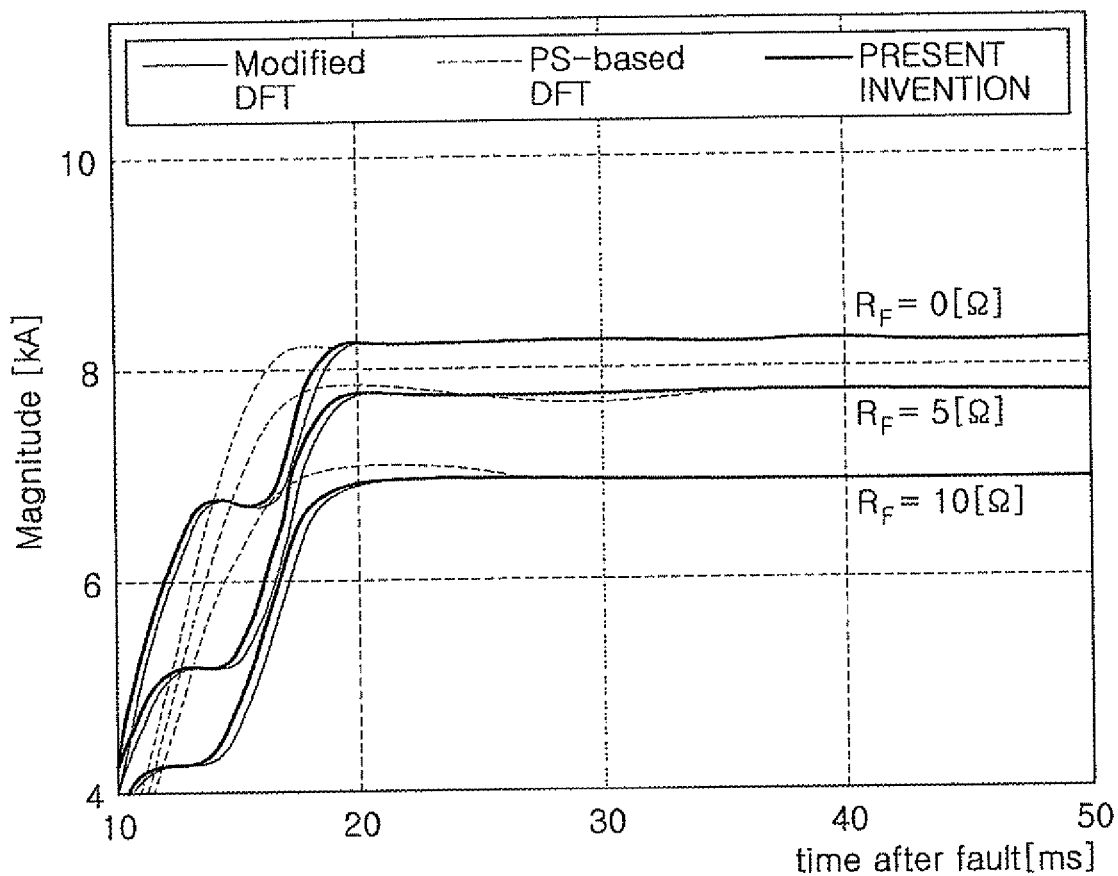
FIG. 3 is a diagram showing another example of the results of a test conduced by the Fourier transform-based phasor estimation apparatus according to the present invention.

FIGS. 2 and 3 are diagrams showing examples of the results of tests on the Fourier transform-based phasor estimation apparatus according to the present invention. For tests, an overhead power transmission line of 354 KV and 50 Km is modeled using an Electromagnetic Transient Program (EMTP), a fault with a fault inception angle of 0°, at which a DC offset component having the maximum magnitude is generated, is considered, a short-distance fault of 10 Km and a long-distance fault of 40 Km, each having fault resistors $R_F$ of 0Ω, 5Ω and 10Ω, are simulated in order to consider variation in the time constant of a DC offset component, and the results of tests of the present invention are shown using the waveforms of the simulation.

As shown in FIGS. 2 and 3, it can be seen that the PS-based DFT method can accurately eliminate the influence of a DC offset and exhibit fast convergence characteristics when no fault resistor exists, but cannot perfectly eliminate the influence of the DC offset when fault resistors exist.

For a fault with a fault resistance, the PS-based DFT method cannot completely remove the adverse influence of the DC offset, as shown in FIGS. 2 and 3, because the fault current contains two or more DC offset components.

In contrast, the Fourier transform-based phasor estimation apparatus according to the present invention can estimate the accurate phasor of a fundamental frequency component because it can completely eliminate the influence of a DC offset even in case of a fault with a fault resistor, and has faster conversion characteristic than that of the Modified DFT method.

In this way, the Fourier transform-based phasor estimation apparatus according to the embodiment of the present invention can not only estimate the phasor of a fundamental frequency component using only one-cycle data of an input signal, but also estimate the phasor of a fundamental frequency component on the basis of the difference between the results of the DFTs on the odd-numbered samples and the even-numbered samples of the input signal. Accordingly, for an input signal including two or more exponentially decaying DC offset components, as well as an input signal including a single exponentially decaying DC offset component, the phasor of a fundamental frequency component can be stably estimated.

Figure 4:
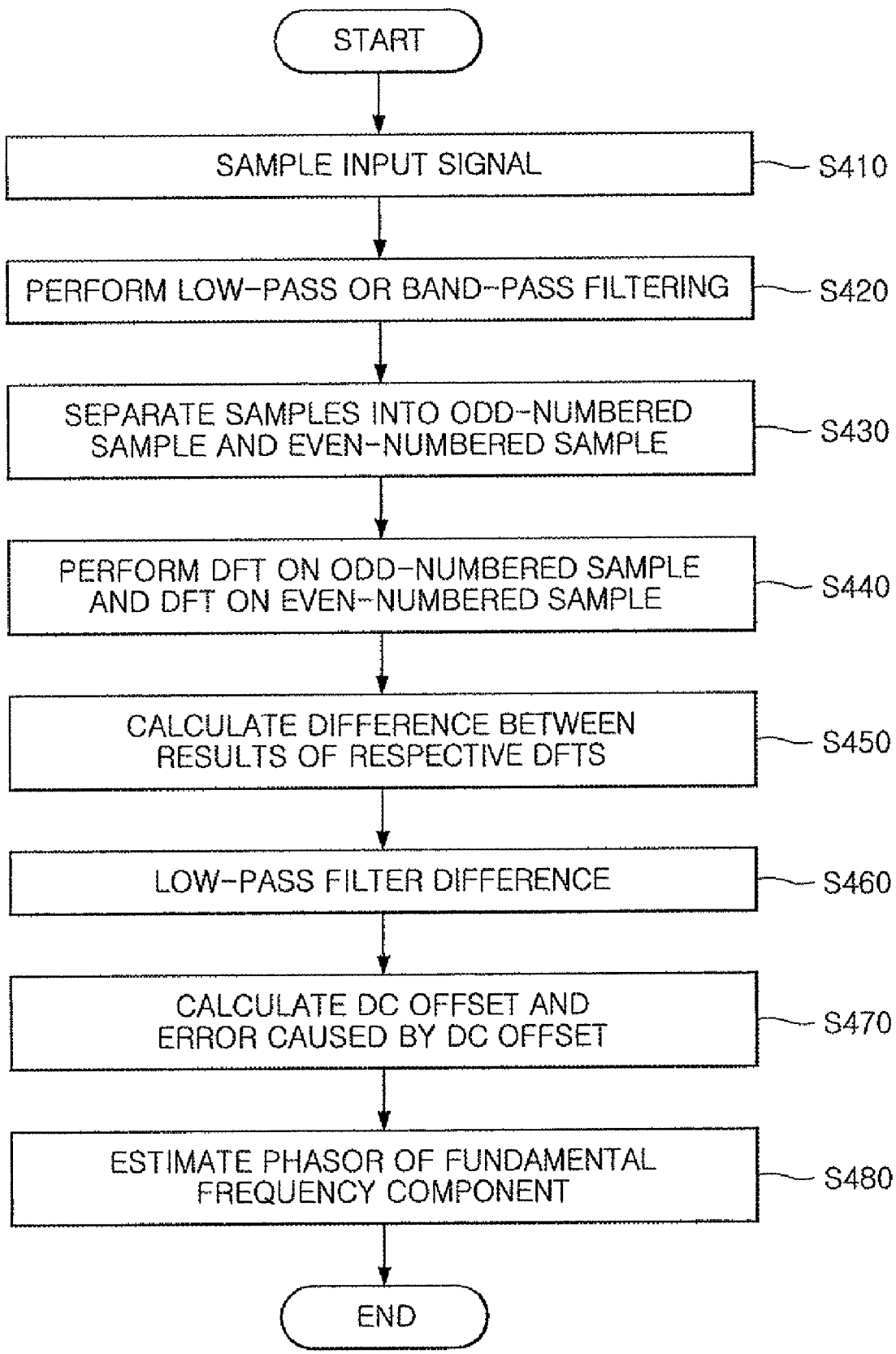
FIG. 4 is a flowchart showing the operation of a Fourier transform-based phasor estimation method according to an embodiment of the present invention.

FIG. 4 is a flowchart of a Fourier transform-based phasor estimation method according to an embodiment of the present invention.

Referring to FIG. 4, in the Fourier transform-based phasor estimation method, an input signal is sampled using an ADC at step S410.

Here, since the Fourier transform-based phasor estimation method according to the present invention can estimate the phasor of a fundamental frequency component using only one-cycle data of the input signal, only one-cycle data can be sampled and used.

Of course, a sampling frequency at which the input signal is sampled can be varied depending on the number of samples desired for one cycle of the input signal.

Further, although not shown in detail in FIG. 4, the Fourier transform-based phasor estimation method according to the present invention can perform sampling after performing low-pass or band-pass filtering on the input signal using an analog filter.

In order to prevent an error attributable to aliasing that may occur due to the separation of odd-numbered samples and even-numbered samples, the samples obtained through sampling are low-pass or band-pass filtered at step S420.

In this case, the samples may be preferably low-pass or band-pass filtered at a cutoff frequency at which N/4-th or higher harmonics can be eliminated.

When the samples are low-pass or band-pass filtered, the filtered samples are separated into odd-numbered samples and even-numbered samples, and thereafter a DFT on the odd-numbered samples and a DFT on the even-numbered samples are respectively performed at steps S430 and S440.

In this case, the results of the DFT on the even-numbered samples and the results of the DFT on the odd-numbered samples can be represented by above Equations [4] and [5], respectively.

The difference between the results of the DFT on the odd-numbered samples and the DFT on the even-numbered samples is calculated. For example, as shown in Equation [6], the difference is calculated by subtracting the results of the DFT on the odd-numbered samples from the results of the DFT on the even-numbered samples at step S450.

After the difference is calculated by subtracting the results of the DFT on the odd-numbered samples from the results of the DFT on the even-numbered samples, the calculated difference is low-pass filtered at a preset filtering frequency, that is, a cutoff frequency, in order to eliminate noise which has been amplified through the difference calculation, at step S460.

A DC offset and an error due to the DC offset on the DFT are calculated using the low-pass filtered difference, that is, the filtered difference between the results of the DFT on the even-numbered samples and the DFT on the odd-numbered samples at step S470.

Here, the magnitude and exponential term of the DC offset can be calculated using the above Equations [6] and [9], respectively, and the error caused by the DC offset can be calculated using the above Equation [10].

When the DC offset and the error caused by the DC offset are calculated at step S470, the phasor of a fundamental frequency component included in the input signal is estimated using both the error caused by the DC offset and the results of a DFT on the input signal at step S480.

In this way, the Fourier transform-based phasor estimation method according to the embodiment of the present invention can stably estimate the phasor of a fundamental frequency component using samples of one-cycle data of the input signal, and can accurately estimate the phasor even when an input signal includes two or more exponentially decaying DC offsets.

Hereinafter, a description will be made by comparing the Fourier transform-based phasor estimation method according to the embodiment of the present invention with the PS-based DFT method and the Modified DFT method in the case where an input signal includes a single DC offset and the case where an input signal includes two DC offsets.

1) Case where a Single DC Offset is Included in an Input Signal

In this case, a description will be made on the assumption that the input signal is given by the following Equation [12].

$$i_1(n) = 100 \cdot e^{-n\Delta t/\tau_1} - 100 \cos\left(\frac{2\pi}{N}\right), n \geq 0 \quad [12]$$

Figure 5:
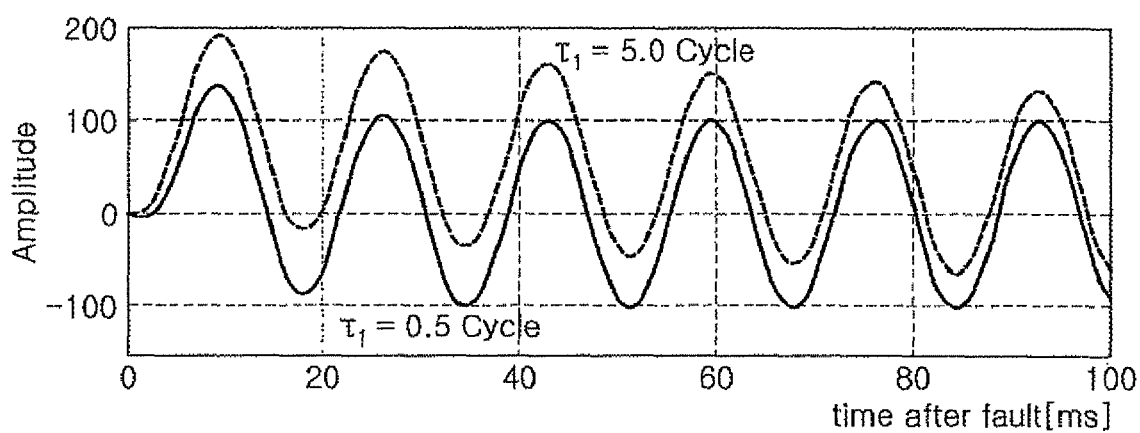
FIG. 5 is a waveform diagram of an input signal, including a single DC offset, relative to a time constant $\tau_1$.

In order to detect the phasor estimation performance of the present invention for the input signal in Equation [12], a time constant $\tau_1$ is set to 0.5 cycle and 5.0 cycles, and FIG. 5 illustrates the waveform of the input signal relative to $\tau_1$.

Figure 6A:
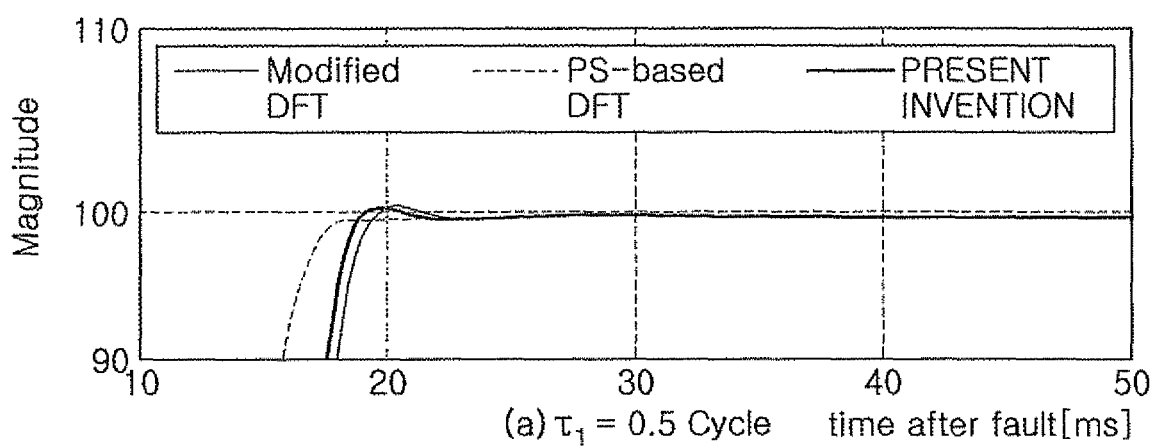
FIGS. 6A and 6B are diagrams showing phasor estimation results respectively obtained by the phasor estimation method of the present invention, a PS-based DFT method, and a modified DFT method, which are performed on the input signal of FIG. 5.
Figure 6B:
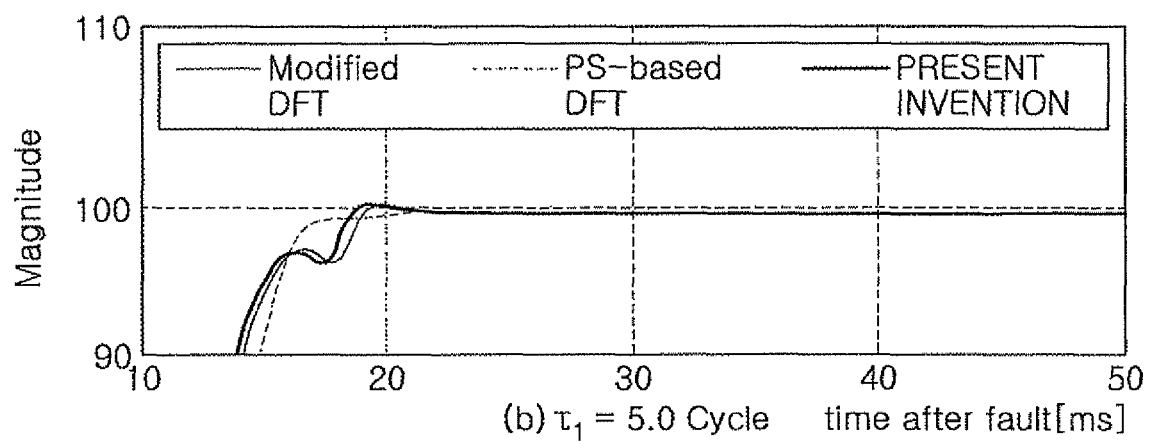

FIGS. 6A and 6B illustrate the results of the phasor estimation for the input signal of FIG. 5, using the phasor estimation method of the present invention, the PS-based DFT method, and the Modified DFT method. It can be seen that the three methods can accurately estimate the phasor of a fundamental frequency component when the input signal contains only one DC offset component.

2) Case where Two DC Offsets are Included in an Input Signal

In this case, a description will be made on the assumption that an input signal is given by the following Equation [13].

$$i_2(n) = 110 \cdot e^{-n\Delta t/\tau_1} - 100 \cos\left(\frac{2\pi}{N}\right) - 10 \cdot e^{-n\Delta t/\tau_2}, n \geq 0 \quad [13]$$

Figure 7:
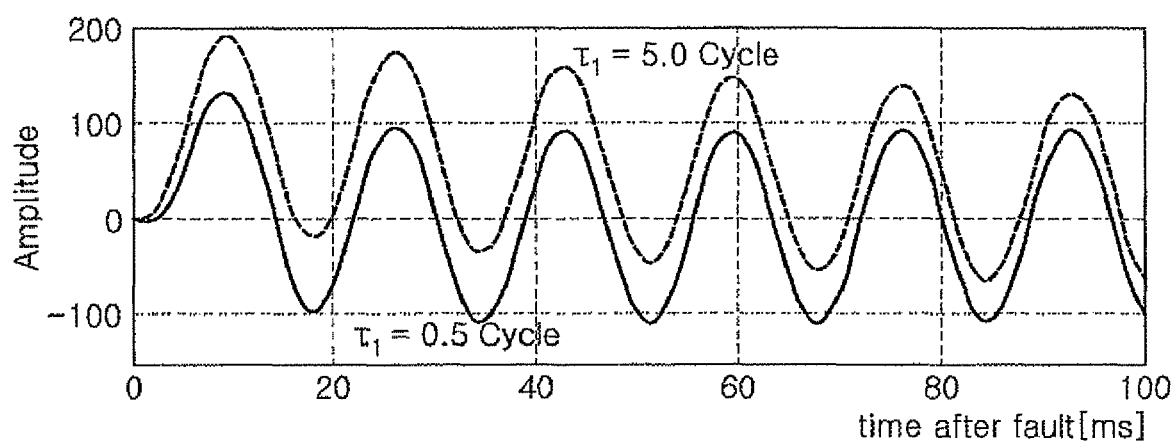
FIG. 7 is a waveform diagram of an input signal, including two DC offsets, relative to a time constant $\tau_1$ in the state in which the time constant $\tau_2$ of the input signal is fixed to 20 cycles.

FIG. 7 is a waveform diagram of an input signal when a time constant $\tau_1$ is 0.5 cycle and 5.0 cycles while a time constant $\tau_2$ is fixed to 20 cycles for the input signal of Equation [13].

Figure 8A:
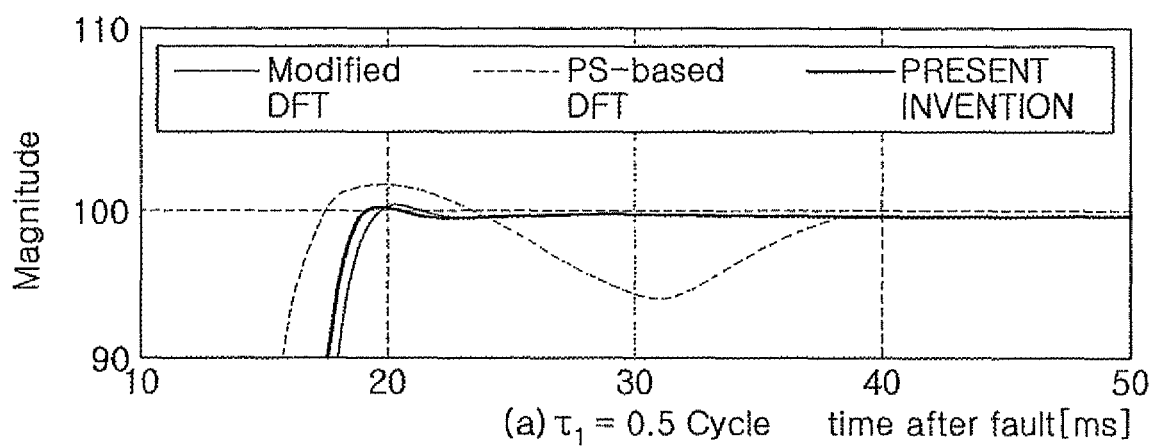
FIGS. 8A and 8B are diagrams showing phasor estimation results respectively obtained by the phasor estimation method of the present invention, a PS-based DFT method, and a modified DFT method, which are performed on the input signal of FIG. 7.
Figure 8B:
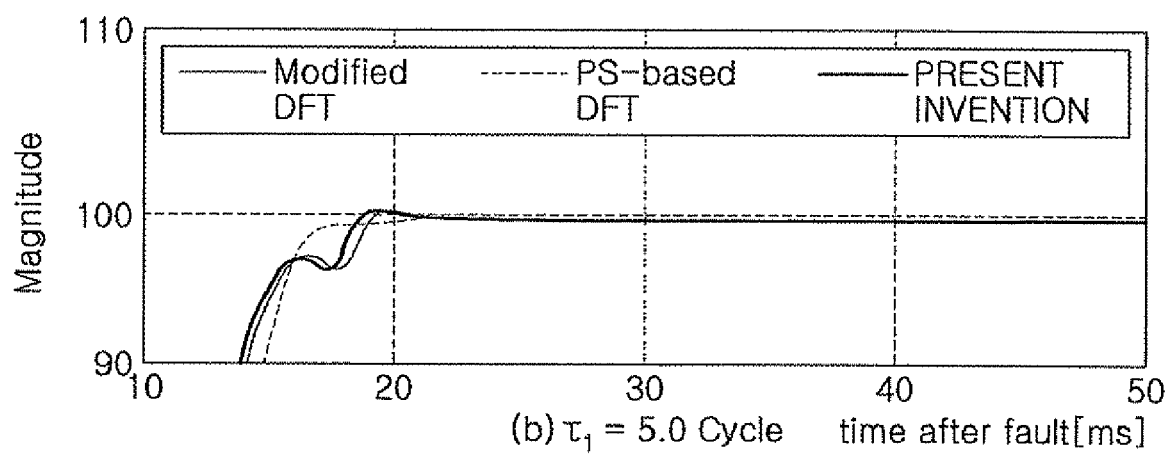

FIGS. 8A and 8B are diagrams showing phasor estimation results respectively obtained by the phasor estimation method of the present invention, a PS-based DFT method, and a modified DFT method, which are performed on the input signal of FIG. 7. It can be seen in FIGS. 8A and 8B that, when $\tau_1$ is 0.5 cycle, the PS-based DFT method cannot perfectly eliminate the influence of the two DC offsets included in the input signal. That is, an error in the PS-based DFT method occurs at the time at which a DC offset component having a small time constant is attenuated and eliminated (refer to FIG. 8A).

Since the PS-based DFT method is performed to separate one-cycle data of an input signal into odd-numbered samples and even-numbered samples, perform two integral operations on the samples, and estimate a DC offset component using the ratio of integral results, it is impossible to accurately estimate the time constant and magnitude of DC offset components using the ratio of integral results when an interval during which two DC offset components coexist, and an interval during which only a single DC offset component exists are present in a single integral section. In particular, when the signs of the two DC offset components are different, and the time constant of a DC offset component having a large magnitude is small, an error caused by the above phenomenon greatly increases.

Meanwhile, as shown in FIGS. 8A to 8B, the phasor estimation method of the present invention and the Modified DFT method can perfectly eliminate the influence of DC offsets. The reason for this is that, even if the input signal of the DFT contains two or more DC offset components, these two method estimate an exponentially decaying DC offset with an approximately equivalent time constant.

As shown in the results of phasor estimation for input signals 1) and 2), the phasor estimation method according to the present invention can accurately estimate the phasor of a fundamental frequency component even if a single DC offset or two DC offsets are included in the input signal.

Further, the modified DFT method additionally uses two samples, in addition to one-cycle data of an input signal to perform a Fourier transform, whereas the present invention uses only one-cycle data of an input signal, thus more rapidly and accurately estimating the phasor of a fundamental frequency component, compared to the modified DFT.

As described above, the Fourier transform-based phasor estimation method according to the embodiment of the present invention can estimate the accurate phasor of a fundamental frequency component by eliminating the influence of DC offsets, without being influenced by system status and fault conditions, thus contributing to all fields requiring the fast and accurate calculation of power signals.

Accordingly, in the Fourier transform-based phasor estimation method and apparatus capable of eliminating exponentially decaying DC offsets according to the present invention, various modifications and applications are possible within the range of the technical spirit of the present invention, and the present invention is not limited to the above embodiments. Further, the embodiments and drawings are intended to describe the content of the present invention in detail, and are not intended to limit the scope of the spirit of the invention. Those skilled in the art will appreciate that various modifications, additions and substitutions are possible, without departing from the scope and spirit of the invention as disclosed in the accompanying claims. The scope of the present invention should be determined to include the claims and equivalents thereof.

What is claimed is:

1. A Fourier transform-based phasor estimation method, comprising:

sampling an input signal and separating samples of one-cycle data of the input signal into at least two groups of samples;

executing a Discrete Fourier Transform (DFT) with each of the sample groups;

calculating a difference between results obtained from the DFTs executed with the sample groups, and calculating a DC offset component included in the input signal on a basis of results of the difference between results obtained from the DFTs;

calculating an error caused by the DC offset on the DFT using the calculated DC offset component; and estimating a phasor of a fundamental frequency component included in the input signal by eliminating the calculated error, caused by the DC offset, from the results of the DFT.

2. The Fourier transform-based phasor estimation method according to claim 1, further comprising:

calculating a difference between results of DFTs executed with the two groups of samples, and filtering the calculated difference with a low-pass filter having a cutoff frequency preset so as to eliminate noise amplified by the difference.

3. The Fourier transform-based phasor estimation method according to claim 1, wherein an exponential term of the DC offset is calculated by the following Equation [2] when the input signal is given by the following Equation [1] and the sample groups are a group of odd-numbered samples and a group of even-numbered samples:

$$i[n] = A_0 e^{-n\Delta t/\tau} + \sum_{k=1}^{N/2-1} A_k \cos\left(\frac{2\pi k}{N}n + \phi_k\right) \qquad [1]$$

where i[n] is the input signal, $A_0$ and $\tau$ are a magnitude and a time constant of the DC offset, $A_k$ and $\phi_k$ are a magnitude and a phase angle of a sinusoidal component of a k-th harmonic, $\Delta t$ is a sampling interval, and N is a number of samples per cycle, $$E = \frac{K_{Im}}{K_{Re}\sin(2\pi/N) - K_{Im}\cos(2\pi/N)} \qquad [2]$$

where E is an exponential term of the DC offset, $K_{Im}$ is an imaginary part of the difference between results of a DFT executed with the odd-numbered sample group and a DFT executed with the even-numbered sample group, and $K_{Re}$ is a real part of the difference.

4. The Fourier transform-based phasor estimation method according to claim 3, wherein the magnitude of the DC offset is calculated by the following Equation [3] on a basis of the calculated exponential term of the DC offset:

$$I_{DFT}^{even} - I_{DFT}^{odd} = \frac{2}{N}A_0 \cdot \frac{1-E^N}{1+E\cdot e^{-j\frac{2\pi}{N}}} \qquad [3]$$

where $I_{DFT}^{even}$ is result of the DFT executed with the even-numbered sample group and $I_{DFT}^{odd}$ is result of the DFT executed with the odd-numbered sample group.

5. The Fourier transform-based phasor estimation method according to claim 1, wherein the error caused by the DC offset is calculated by the following Equation [4] on a basis of the calculated DC offset when the sample groups are a group of odd-numbered samples and a group of even-numbered samples:

$$I_{DFT}^{dc} = (I_{DFT}^{even} - I_{DFT}^{odd}) \cdot \frac{1+E\cdot e^{-j\frac{2\pi}{N}}}{1-E\cdot e^{-j\frac{2\pi}{N}}} \qquad [4]$$

where $I_{DFT}^{dc}$ an error due to the DC offset on the DFT, $I_{DFT}^{even}$ is result of a DFT executed with the even-numbered sample group, $I_{DFT}^{odd}$ is result of a DFT executed with the odd-numbered sample group, E is an exponential term of the DC offset, and N is a number of samples per cycle.

6. A Fourier transform-based phasor estimation apparatus, comprising:

a separation unit for separating samples of one-cycle input data into at least two sample groups;

a Discrete Fourier Transform (DFT) unit for executing a DFT with each of the sample groups, obtained from the separation unit;

a DC offset calculation unit for calculating a DC offset, included in the input signal, on a basis of results of a difference between results obtained from the DFTs executed with the sample groups, and calculating an error caused by the DC offset using the calculated DC offset; and a phasor estimation unit for estimating a phasor of a fundamental frequency component included in the input signal by eliminating the error caused by the DC offset, calculated by the DC offset calculation unit, from the results of the DFT executed with the input signal.

7. The Fourier transform-based phasor estimation apparatus according to claim 6, further comprising:

a difference calculation unit for calculating a difference between results obtained from the DFTs executed with the sample groups performed by the DFT unit; and a difference filter unit for filtering the output of the difference calculation unit with a low-pass filter having a pre-set cutoff frequency and outputting a filtered signal to the DC offset calculation unit to eliminate noise amplified through difference calculation performed by the difference calculation unit.

* * * * *

UNITED STATES PATENT AND TRADEMARK OFFICE
CERTIFICATE OF CORRECTION

| | |
|---|---|
| PATENT NO. | : 8,145,443 B2 |
| APPLICATION NO. | : 12/423223 |
| DATED | : March 27, 2012 |
| INVENTOR(S) | : Sang Hee Kang et al. |

Page 1 of 1

It is certified that error appears in the above-identified patent and that said Letters Patent is hereby corrected as shown below:

IN THE CLAIMS:

Column 12, Line 17, Claim 5, before "an" insert -- is --

Signed and Sealed this
Twenty-sixth Day of June, 2012

David J. Kappos
*Director of the United States Patent and Trademark Office*